United States Patent [19]
Wu

[11] Patent Number: 5,829,993
[45] Date of Patent: Nov. 3, 1998

[54] CHARGER WITH A REPLACEABLE ELECTRICAL PLUG

[75] Inventor: Michael Wu, Taipei Hsien, Taiwan

[73] Assignee: Formosa Electronic Industries Inc., Taipei Hsien, Taiwan

[21] Appl. No.: 767,410

[22] Filed: Dec. 16, 1996

[51] Int. Cl.[6] .............................. H01R 29/00; H01R 13/44
[52] U.S. Cl. ......................... 439/131; 439/172; 439/956
[58] Field of Search .................................... 439/131, 171, 439/172, 956

[56] References Cited

U.S. PATENT DOCUMENTS

| | | | |
|---|---|---|---|
| 5,494,449 | 2/1996 | Chioo | 439/131 |
| 5,613,863 | 3/1997 | Klaus et al. | 439/131 |
| 5,628,641 | 5/1997 | Hahn | 439/131 |
| 5,634,806 | 6/1997 | Hahn | 439/172 |
| 5,713,749 | 2/1998 | Wu | 439/956 |

*Primary Examiner*—Neil Abrams
*Attorney, Agent, or Firm*—Beveridge, DeGrandi, Weilacher & Young, L.L.P.

[57] ABSTRACT

A charger with replaceable electrical plugs includes a casing 1 including a lower casing 11 and an upper casing 12. An electronic power supply circuit 13 is accommodated inside the casing 1. The lower casing 11 has an opening 111 having a replaceable two prong electrical plug 14 pivotally disposed therein to adapt to different specifications of electrical sockets used in different countries. The power supply circuit 13 may convert AC into low voltage DC for use, through a cable 131, by small electrical appliances. The upper housing 12 is provided with a tubular recess 121 pivotally provided with a cigarette lighter plug 15 which may fit into a car's cigarette lighter socket. The power supply circuit 13 may transform the car's high voltage DC into a low voltage DC to provide electric power outdoors. The pivotally disposed plug 14 may be replaced with a non-pivotal plug 14' (FIG. 6). A rod 1722 may be depressed to disengage locking means 1721, 163 and then be moved transversely to cause joint movement of slide seat 17 and fastening piece 115 into position of locking or releasing one or the other of the plugs 14.

2 Claims, 7 Drawing Sheets

5,829,993

CHARGER WITH A REPLACEABLE ELECTRICAL PLUG

BACKGROUND OF THE INVENTION (a) Field of the Invention

The present invention relates generally to a charger, and more particularly to a charger with a replaceable electric plug for matching the different specifications of electrical sockets adopted in different countries, the casing of the charger being further provided with a cigarette lighter plug for utilizing the electric power of cars when outdoors.

(b) Description of the Prior Art

Portable electrical appliances such as mobile phones, electric shavers, and walkmans have their specific rechargeable batteries or concealed batteries. They are generally used with specific chargers. For travelers, when the power of their batteries is used up, it is oftentimes difficult to directly utilize local electric power to recharge the batteries due to different specifications of electric sockets.

Furthermore, since the standard voltages vary from country to country, even if the travelers have the right type of electrical plugs, the difference in standard voltages may make it impossible to directly utilize the local electric power in recharging. If the output dc voltage is too high, it will damage the electrical appliance. If the voltage is too low, the electrical appliance will not function.

In addition, although some electrical appliances are equipped with chargers or electric plugs to match the specifications of electric sockets or standard voltages of specific countries. Generally, they are restricted to larger appliances. Besides, it is unfeasible if not impossible to have various chargers adapt to the standard voltages of countries around the world for people who travel to various countries.

Moreover, even though some countries may adopt the same standard voltage, the specifications of the electrical sockets are different. It is therefore only necessary to provide a matching connector. However, such connectors are generally large in size and are therefore not suitable for travelers.

As mentioned above, travelers generally use mobile phones. The battery compartment of the mobile phone can store limited electric power and frequent replacement is necessary. For travelers, it is therefore necessary to recharge the batteries when stopping at a hotel. But, as described above, if the right electrical plug is not available or the standard voltage is different, the charger will have no use.

Furthermore, ordinary chargers can convert ac into low voltage dc. In other words, they can only be used indoors. Chargers for utilizing outdoor electric power are not available. Although cars are provided with specific electric plugs and transformers for small electrical appliances, it is necessary to carry a different charger, which is very inconvenient, especially to traveling businessmen.

In consideration of the above-described problems, the inventor of the present invention has conceived a charger with a replaceable electric plug for matching different specifications of electrical sockets adopted in different countries. The charger is provided with an electronic power supply circuit for converting the standard voltages of different countries into a dc voltage for use by small electrical appliances. The charger may also utilize the electric power of cars when outdoors. According to the present invention, the charger essentially comprises a casing comprised of a lower casing and an upper casing. The lower casing has an opening accommodating an inner casing, which in turn has mounted therein two electrically conductive pieces connected to an electronic power supply circuit. The inner casing is provided with a slide seat with a spring disposed between the inner casing and the slide seat. Both sides of the inner casing are respectively provided with a curved notch, while both sides of the slide seat are respectively provided with a half pivot seat. Both sides of the opening are also respectively provided with a curved pivot seat. The half pivot seats, the curved notches and curved pivot seats together form two pivot holes for mounting thereon a replaceable electrical plug. The electrical plug has a contact terminal which may contact the conductive pieces when the plug is turned outwardly. The slide seat may be pushed so that the half pivot seats may separate from the curved notches and curved pivot seats to allow removal of the electrical plug from the pivot holes. The upper casing is pivotally connected to a cigarette lighter plug whereby the electronic power supply circuit may convert a car's high voltage dc into low voltage dc for use by small electrical appliances.

SUMMARY OF THE INVENTION

Accordingly, a primary object of the present invention is to provide a charger with a replaceable electrical plug which may match different specifications of electrical sockets adopted in different countries and which may convert the local standard voltage of any country into a dc voltage for use by small electrical appliances.

Another object of the present invention is to provide a charger with a replaceable electrical plug wherein the charger has a casing pivotally provided with a cigarette lighter plug for converting a car's high voltage dc into low voltage dc for use by small electrical appliances when outdoors.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
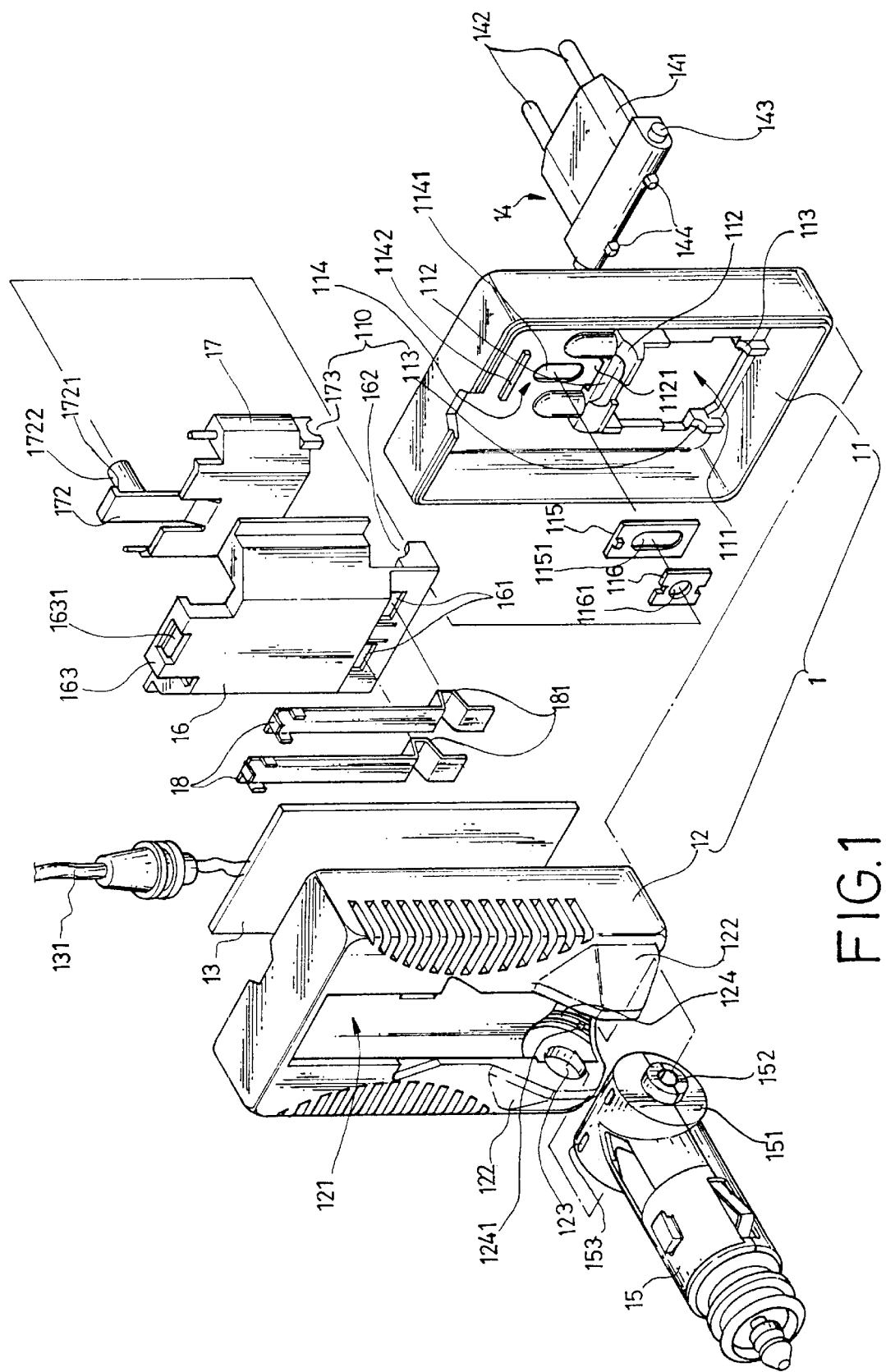
FIG. 1 is an elevational exploded view of the present invention.
Figure 2:
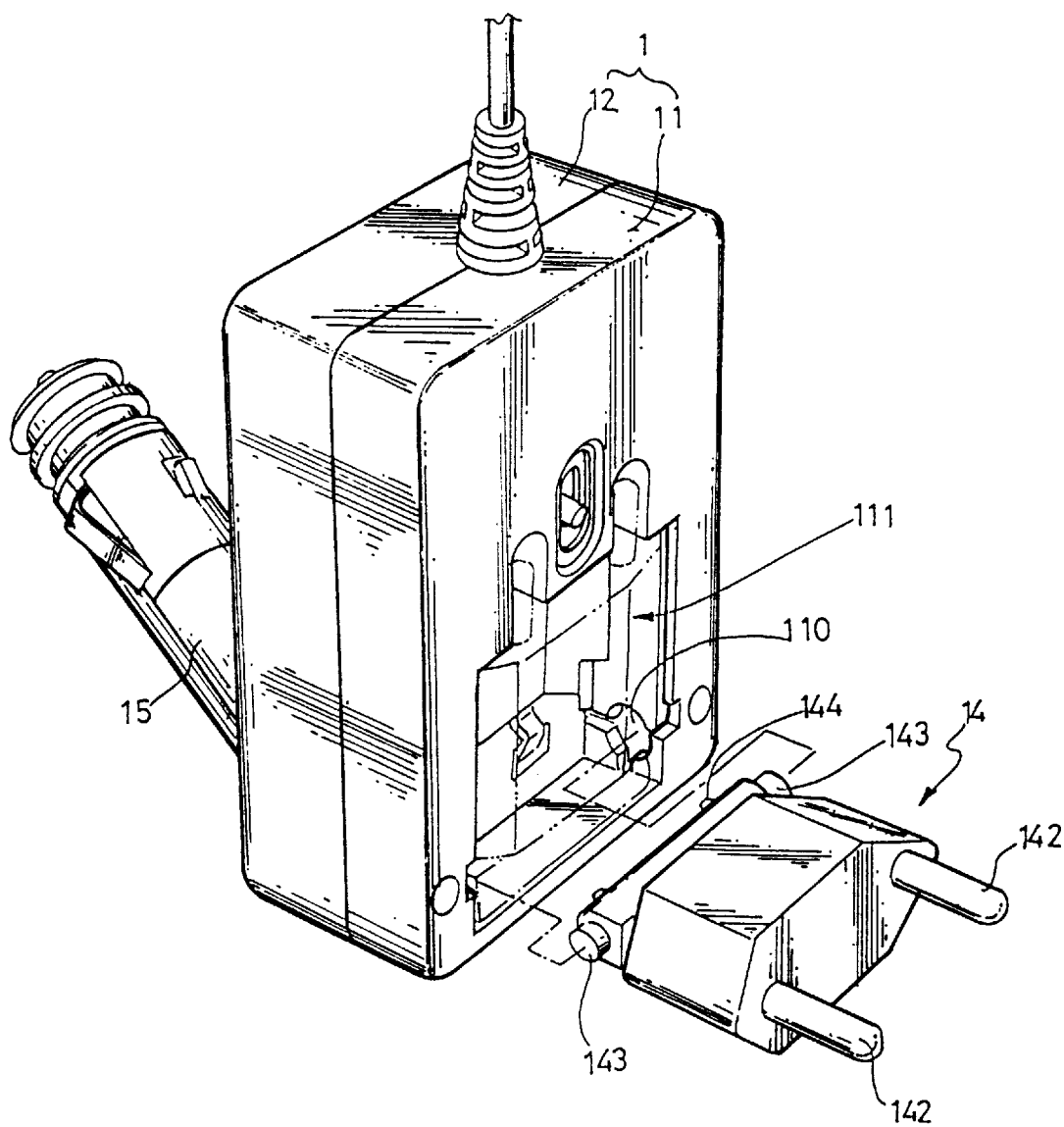
FIG. 2 is an elevational view of the present invention.

With reference to FIGS. 1 and 2, the present invention essentially comprises a casing 1 comprised of a lower casing 11 and an upper casing 12, an electronic power supply circuit 13 being accommodated therein for lowering dc voltage and converting ac voltage. The housing 1 may match a plurality of replaceable electric plugs 14. A suitable replaceable electric plug 14 may be mounted in the lower casing 11 so that the casing 1 may match different types of electric sockets adopted in different countries. The upper casing 12 has a cigarette lighter plug 15 pivotally provided thereon so that the casing 1 may be plugged into a car's cigarette lighter socket (not shown) to utilize the car's electric energy. The structure and relationship of the structural elements will now be described in detail hereinbelow.

The lower casing 11 is provided with an opening 111 at a suitable position, a projecting seat 112 at a rear edge inside the opening 111. The projecting seat 112 is provided with a rectangular hole 1121 thereon. A slide groove 114 is provided inside the lower casing 11 to the rear of the projecting seat 112. The slide groove 114 is provided with an elongated slot 1141 therein, a stop block 1142 being provided behind the slide groove 114. A movable fastening piece 115 and a positioning slide piece 116 are mounted above the slide groove 114. The movable fastening piece 115 is provided with an elongated hole 1151, and the positioning slide piece 116 is provided with a circular hole 1161. The movable fastening piece 115 is inserted into the rectangular hole 1121 of the projecting seat 112. At either end of a front edge inside the opening 111 is provided a curved pivot seat 113. Inside the lower casing 11 and corresponding to the opening 11 is secured an inner casing 16. On the surface of the front end of the inner casing 16 are provided two slots 161. At either side wall of the front end of the inner casing 16 is provided a curved notch 162. A fastening seat 163 is further protrudently disposed at the middle of the rear end of the inner casing 16, with a fastening hole 1631 disposed thereon.

A slide seat 17 is fitted inside the inner casing 16 of the lower casing 11 such that it may reciprocate therein. An elastic fastening piece 172 is protrudently disposed at the middle of the rear end of the slide seat 17. The elastic fastening piece 172 has a protrudent block 1721 thereon, and a circular rod 1722 fitted thereon. The circular rod 1722 may be inserted into the elongated hole 1151 of the movable fastening piece 115 and the circular hole 1161 of the positioning slide piece 116, as well as the elongated slot 1141 of the lower casing 11, such that, by means of pushing the circular rod 1722 inwardly to press the slide seat 17, the protrudent block 1721 of the elastic fastening piece 172 may engage the fastening hole 1631 of the inner casing 16, causing the movable fastening piece 115 to extend outwardly to retract with the movement of the slide seat 17. Either lateral side of the front end of the slide seat 17 is provided with a half pivot seat 173 which may form a pivot hole 110 with the curved pivot seat 113 of the lower casing 11 and the curved notch 162 of the inner casing 16.

Two electrically conductive pieces 18 disposed at the bottom of the inner casing 16. Each conductive piece 18 has a bent portion 181 at the front end for matching the slot 161 of the inner casing 16. The rear end thereof is connected to the electronic power supply circuit 13.

The replaceable electric plug 14 includes a plastic plug body 141 with a plurality of electrically conductive legs 142 for matching an electric socket. Both sides of the rear end of the plug body 141 are respectively provided with a protrudent pivot 143 which may fit into the pivot hole 110 formed by the half pivot seat 173 of the slide seat 17, the curved pivot seat 113 of the lower casing 11 and the curved notch 162 of the inner casing 16. The legs 142 extend rearwardly to have two contact terminals 144 projecting from the rear edge of the plug body 141 such that the contact terminals 144 may contact the bent portions 181 of the two conductive pieces 18 when the plug 14 is turned outwardly after assembly.

The upper casing 12 is provided with a tubular recess 121 at a suitable position. Below the recess 121 is disposed a pair of pivot seats 122 each being provided with a pivot hole 123. A plurality of elastic arms 124 are further disposed in the recess 121 at suitable positions. Each elastic arm has a boss 1241. The above-mentioned cigarette lighter plug 15 may be pivotally provided on the pivot seats 122. The bottom side of the cigarette lighter plug 15 is provided with a cylindrical element 151 having a short pivot 152 provided at either side thereof and a plurality of depressions 153 on its peripheral surface. The short pivots 152 may fit into the pivot holes 123 of the pivot seats 122 so that the cigarette lighter plug 15 may be pivotally mounted on the pivot seats 122 of the upper casing 12, and the bosses 1241 in the recess 121 may engage the depressions 153 of the cylindrical element 151.

Figure 3:
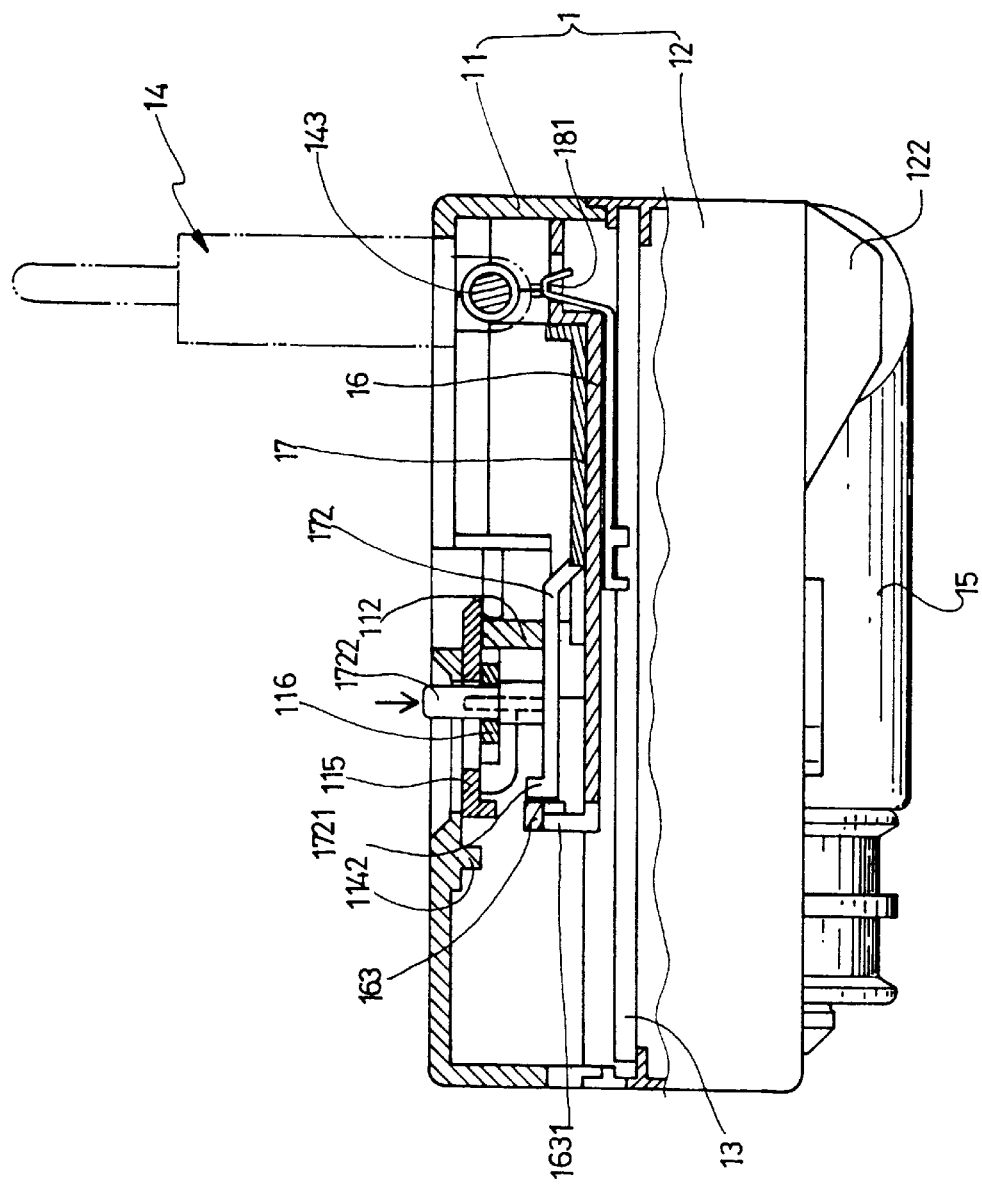
FIG. 3 is a sectional view of a replaceable electrical plug according to the present invention.

In practice, referring to FIG. 3, the protrudent pivots 143 at both sides of the plug body 141 of the electrical plug 14 are pivotally mounted in the pivot holes 110 formed by the half pivot seats 173 of the slide seat 17, the curved pivot seats 113 of the lower casing 11 and the curved notches 162 of the inner casing 16. Since the lower casing 11 has the opening 111, the electrical plug 14 may turned inwardly to be stored within the casing 1. Furthermore, when the electrical plug 14 is turned outwardly, the contact terminals 144 thereof will contact the conductive pieces 18. Therefore, ac currents may flow via the legs 142 of the electrical plug 14 through the conductive pieces 18 to the power supply circuit 13 which converts them into dc currents. The electronic power supply circuit 13 may convert the standard voltages of different countries into dc currents required by small portable electrical appliances.

Figure 4:
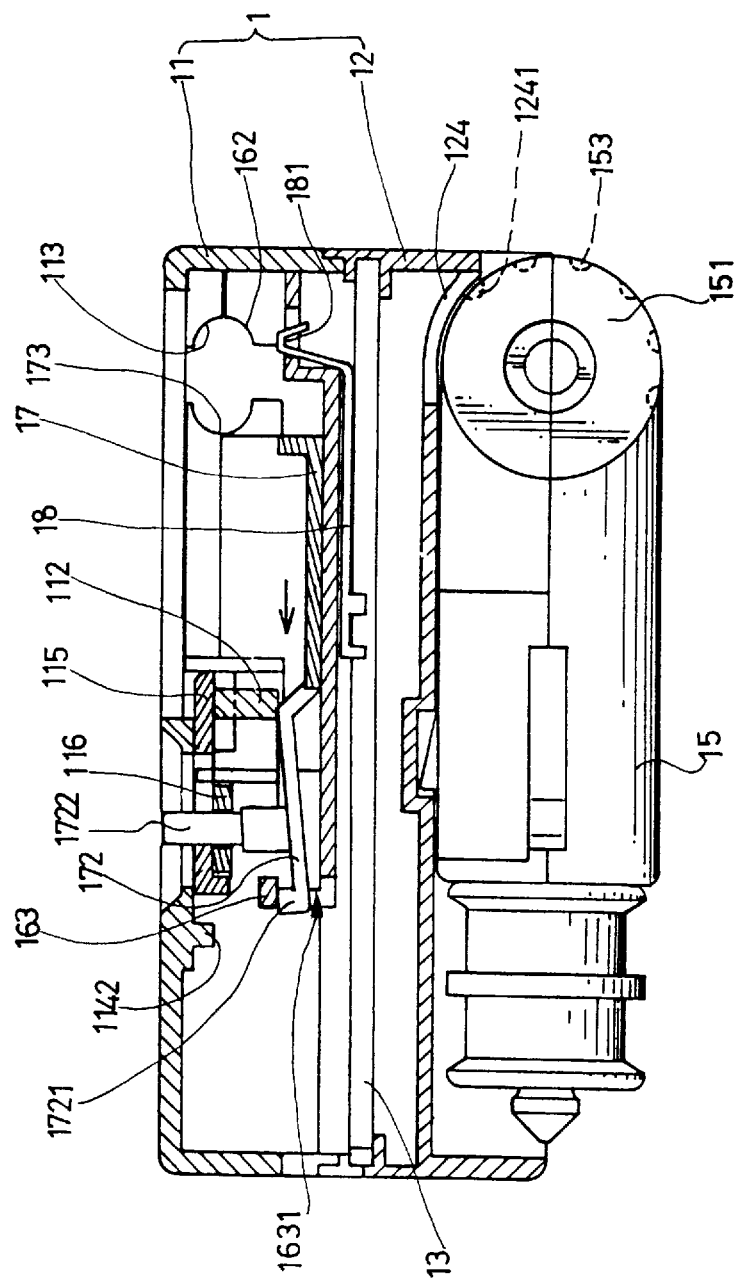
FIG. 4 is a sectional view illustrating the half opening state of the slide seat according to the present invention.

Furthermore, since the specifications of the electrical sockets vary from country to country, various electrical plugs 14 designed in different specifications may be used. In replacing the electrical plug 14 such as a two prong one, the electrical plug 14 is turned outwardly and the circular rod 1722 on the elastic fastening piece 172 of the slide seat 17 is pushed so that the slide seat 17 slidably displaces inwardly, hence the half pivot seats 173 on the slide seat 17 disengages from the curved notches 162 of the inner casing 16, and the curved pivot seats 113 of the lower casing 11 to release the pivots 143 at both sides of the electrical plug 14, as shown in FIG. 4. The electrical plug 14 may then be removed, and a suitable one may be connected to the casing 1 in the following manner. Firstly, the pivots 143 at both sides of the electrical plug 14 are rested on the curved notches 162 at both sides of the inner casing 16. Then, by pressing the circular rod 1722 of the slide seat 17 to push the slide seat 17 inwardly so that the half pivot seats 173 rest on the protrudent pivots 143 and fit with the curved notches 162 and the curved pivot seats 113. Then the upper end of the elastic fastening piece 172 of the slide seat 17 abuts the lower side of the fastening seat 163 of the inner casing 16 to position the slide seat 17 so that the electrical plug 14 may be pivotally positioned in the pivot holes 110 thus formed, as shown in FIG. 3. Besides, as the opening 111 of the lower casing 11 is configured to have a maximum size to fit all specifications of electrical plugs, any size of electrical plugs 14 may be swung rearwardly to be stored inside the casing 1 to save space and facilitate carrying and storage.

Figure 5:
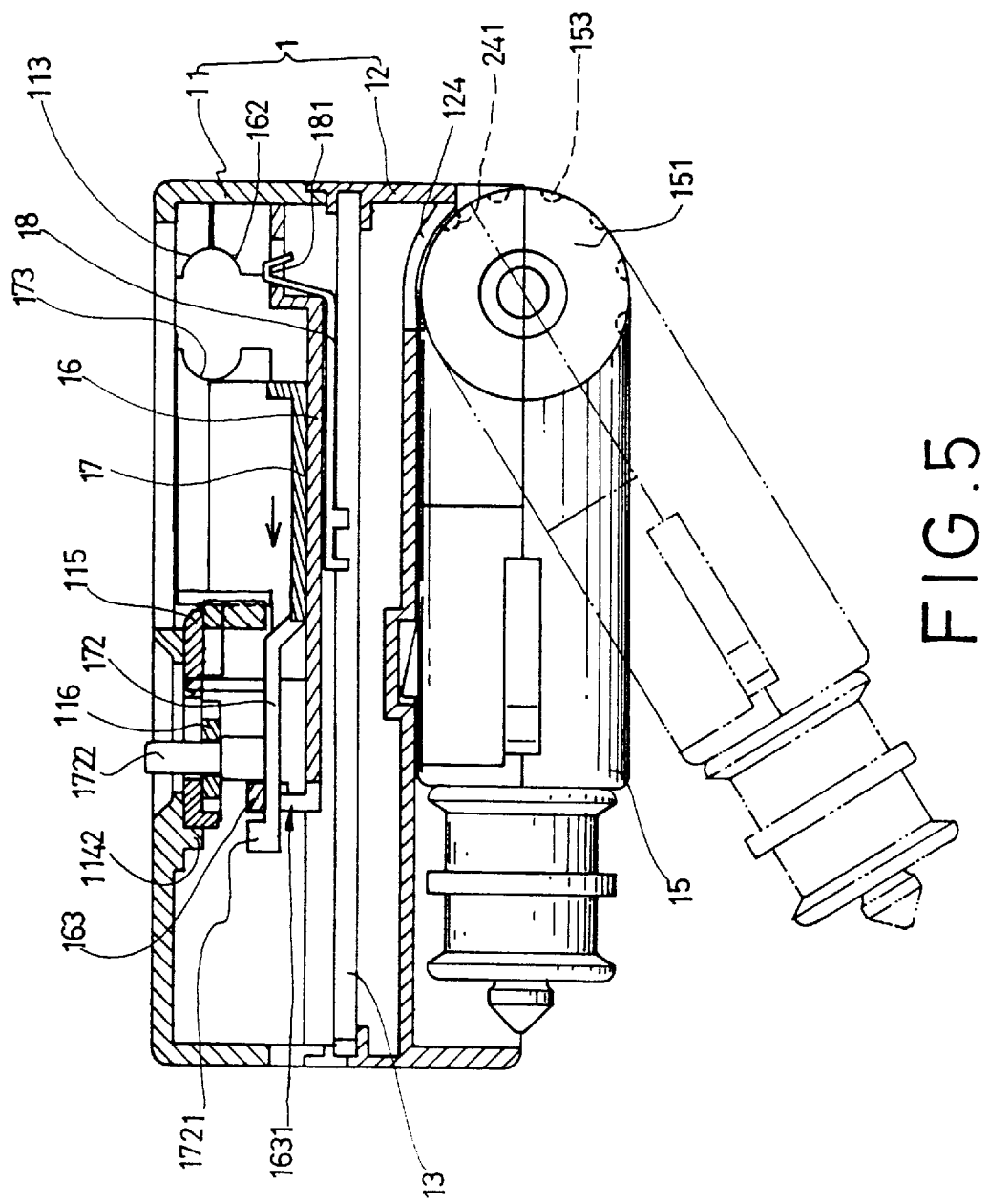
FIG. 5 illustrates the fully open state of the slide seat according to the present invention.
Figure 6:
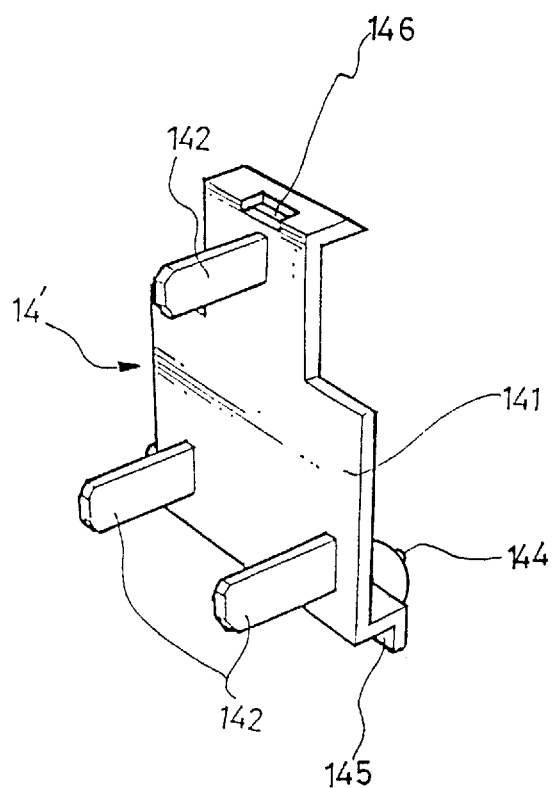
FIG. 6 is an elevational view of the replaceable electrical plug of another embodiment.
Figure 7:
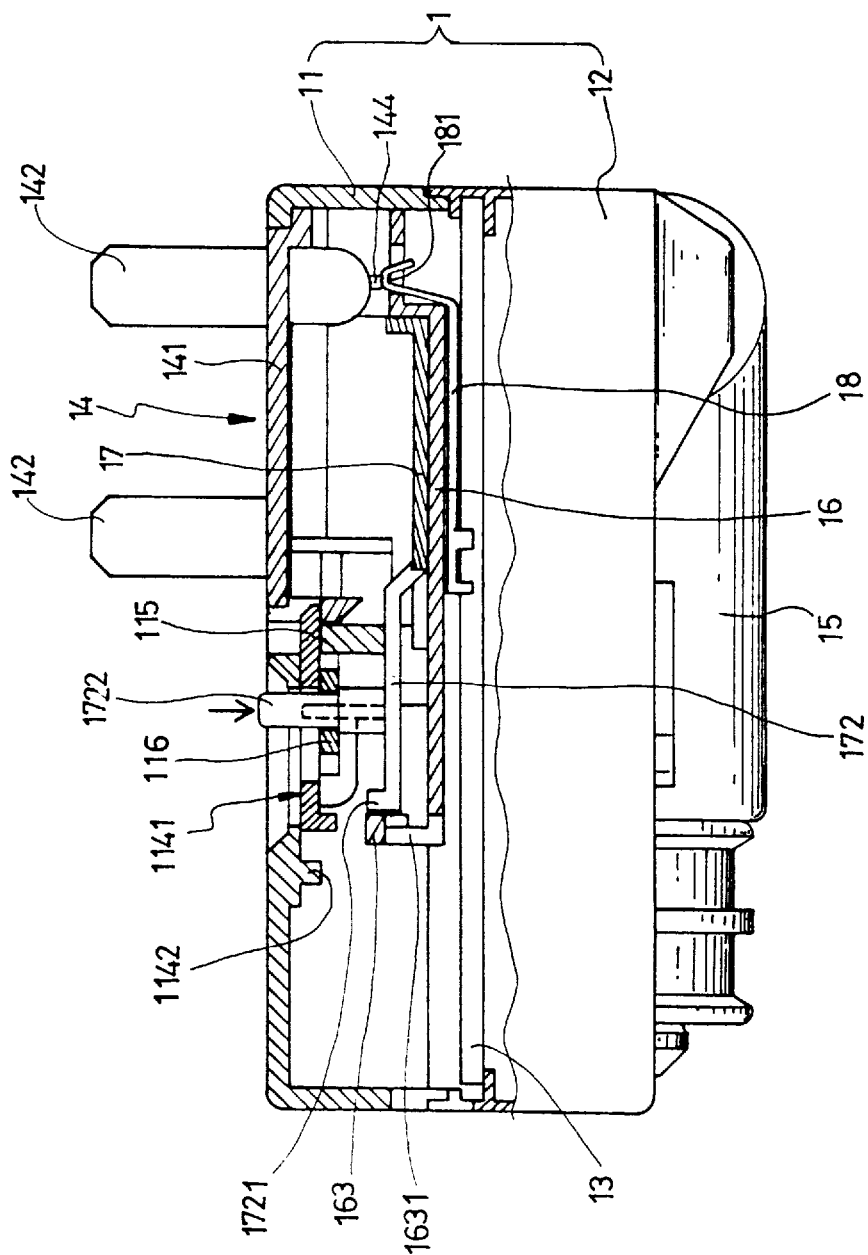
FIG. 7 is a sectional view of the electrical plug shown in FIG. 6.

With reference to FIGS. 5 and 6, the electrical plug 14' may be configured to have three electrically conductive legs 142 to match a three-hole electrical socket. The plug body 141 may be plate-like structure provided with a protrudent piece 145 at its lower side. The upper side of the plug body 141 is provided with a positioning indentation 146. The protrudent piece 145 of the plug body 141 may be utilized to urge against the inner edge of the opening 111 of the lower casing 11 and, by pushing the circular rod 1722 of the slide seat, the slide seat 17 may displace outwardly. As the slide groove 114 of the lower casing 11 is provided with the movable fastening piece 115 and the positioning slide piece 116, and the circular rod 1722 of the slide seat 17 is fitted on the movable fastening piece 115 and the positioning slide piece 16, when the slide seat 17 displaces forwardly, the movable fastening piece 115 projects outwardly to engage the positioning indentation 146 at the upper side of the plug body 141. Besides, the two contact terminals 144 at the rear edge of the electrical plug 14 urge against the bent portions 181 of the two conductive pieces 18. In this way, the three-prong electrical plug 14 maybe mounted in the opening 111 of the lower casing 11, as shown in FIG. 7. If a two-prong electrical plug 14 is used, since there is no need for fastening or positioning to facilitate plugging out thereof, the movable fastening piece 115 will not have any fastening function in using the two-prong electrical plug 14.

Furthermore, the length of the elongated hole 1151 of the movable fastening piece 115 is slightly smaller than that of the elongated slot 1141 of the lower casing 11, and the positioning slide piece 116 has only a circular hole 1161, if the slide seat 17 is in a fastened state as shown in FIG. 3, the movable fastening piece 115 is in a projecting state. Therefore, when the slide seat 17 is pushed to displace, the positioning slide piece 116 will move with the slide seat 17 first, while the movable fastening piece 115 remains stationary. At this point, the slide seat 17 is at a first stage of half opening, and a two-prong electrical plug 14 may be replaced, as shown in FIG. 4. After the two-prong electrical plug 14 has been replaced, the slide seat 17 may be pushed back so that it is in a fastened state. If the slide seat 17 is being pushed further inwardly, the movable fastening piece 115 and the positioning slide piece 116 will synchronously displace inwardly so that the movable fastening piece 115 retracts. At this point, the slide seat 17 is in a second stage of fully opened, as shown in FIG. 5, so that a three-prong electrical plug 14 may be replaced. After replacement, the slide seat 17 is pushed outwardly completely so that it is surely fastened and the movable fastening piece 115 may be positioned in the positioning indentation 146 at the upper side of the electrical plug 14 to secure the electrical plug 14 in the opening 111 of the lower casing 11, as shown in FIG. 7.

Since the electrical plug 14 may be replaced easily, the present invention, used in conjunction therewith and the electronic power supply circuit 13, may be used to charge rechargeable batteries without any problems. And since the electrical plugs 14 are comprised of a plastic plug body 14 and two legs 142, they are compact in size and convenient to carry and store, giving traveling businessmen or tourists convenience to obtain electric power for using small portable electrical appliances.

In addition, the outputs of the power supply circuit 13 may be connected, through cable 131, to the charging means of a mobile phone or any other electrical appliances to provide power for recharging of batteries.

Furthermore, as the cigarette lighter plug 15 on the upper casing 12 has depressions 153 on its circumference, and the bosses 1241 in the recess 121 may fit into the depressions 153, when the cigarette lighter plug 15 is turned, it may be positioned at any point due to the depressions 153 retaining the bosses 1241 of the recess 121, as shown in FIGS. 4 and 5. When not in use, the cigarette lighter plug 15 may be turned inwardly to be hidden in the recess 121 of the upper casing 12 to save space.

Therefore, when it is necessary to utilize dc outdoor, the cigarette lighter plug 15 may be turned outwardly to fit into a car's cigarette lighter socket (not shown) to use the electric power of the car. By means of the power supply circuit 13, the high voltage dc of the car may be converted into a low voltage dc suitable for common electrical appliances.

In summary, the present invention makes it possible to utilize cars'electric power as well as household electric power. The design of the replaceable electric plug also makes it easy for travelers to utilize indoor electric power for recharging and other purposes.

Although the present invention has been illustrated and described with reference to the preferred embodiment thereof, it should be understood that it is in no way limited to the details of such embodiment but is capable of numerous modifications within the scope of the appended claims.

What is claimed is:

1. A charger comprising:

a replaceable electrical plug, a casing (1) including a lower casing (11) and an upper casing (12), said casing (1) accommodating therein an electronic power supply circuit (13) for lowering the voltage of direct currents and converting the voltage of alternating currents, said casing (1) being adopted for use with a plurality of replaceable electrical plugs (14) to match different specifications of electrical sockets, said casing (1) further having a cigarette lighter plug (15) pivotally disposed thereon for obtaining the electric power of a car by fitting said cigarette lighter plug (15) into the car's cigarette lighter socket, wherein said lower casing (11) is provided with an opening (111) at a suitable position, a projecting seat (112) at a rear edge inside the opening (111), said projecting seat (112) being provided with a rectangular hole (1121) thereon, a slide groove (114) being provided inside said lower casing (11) to the rear of said projecting seat (112), said slide groove (114) being provided with an elongated slot (1141) therein and a stop block (1142) to the rear thereof, a movable fastening piece (115) and a positioning slide piece (116) being mounted above said slide groove (114), said movable fastening piece (115) having an elongated hole (1151) and said positioning slide piece (116) having a circular hole (1161), said movable fastening piece (115) being inserted into said rectangular hole (1121) of said projecting seat (1112), a curved pivot seat (113) being disposed at either end of a front edge inside said opening (111), an inner casing (16) being secured inside said lower casing (11) corresponding to said opening (111), two slots (161) being provided on the surface of the front end of said inner casing (16), and a fastening seat (163) with a fastening hole (1631) being disposed at the middle of the rear end of said inner casing (16);

a slide seat (17) is fitted inside said inner casing (16) of said lower casing (11) such that it may reciprocate therein, an elastic fastening piece (172) being disposed at the middle of the rear end of said slide seat (17), and having a protrudent block (1721) thereon and a circular rod (1722) fitted thereon, said circular rod (1722) being inserted into said elongated hole (1151) of said movable fastening piece (115) and said circular hole (1161) of said positioning slide piece (116), as well as said elongated slot (1141) of said lower casing (11), such that, by means of pushing said circular rod (1722) inwardly to press said slide seat (17), said protrudent block (1721) of said elastic fastening piece (172) may disengage said fastening hole (1631) of said inner casing (16), motion of said slide seat (17) causing said movable fastening piece (115) to project outwardly to retract with the movement of said slide seat (17); either lateral side of the front end of said slide seat (17) being provided with a half pivot seat (173) which forms a pivot hole (110) with said curved pivot seat (113) of said lower casing (11) and said curved notch (162) of said inner casing (16);

two electrically conductive pieces (18) dispose at the bottom of said inner casing (16), each of which having a bent portion (181) at the front end for matching said slot (161) of said inner casing (16), the rear end thereof being connected to said electronic power supply circuit (13);

said replaceable electric plug (14) includes a plastic plug body (141) with a plurality of electrically conductive legs (142) for matching an electric socket, both sides of the rear end of said plug body (141) being respectively provided with a protrudent pivot (141) which may fit into the pivot hole (110) formed by said half pivot seat (173) of said slide seat (17), said curved pivot seat (113) of said lower casing (11) and said curved notch (162) of said inner casing (16), said legs (142) extending rearwardly to have two contact terminals (144) projecting from the rear edge of said plug body (141) such that said contact terminals (144) may contact said bent portions (181) of said two conductive pieces (18) when said electrical plug (14) is turned outwardly after assembly; and said upper casing (12) is provided with a tubular recess (121) at a suitable position, a pair of pivot seats (122) each having a pivot hole (123) being disposed below said recess, a plurality of elastic arms (124) being disposed in said recess (121) at suitable positions, each of said elastic arms having a boss (1241); and said cigarette lighter plug (15) is pivotally provided on said pivot seats (122), the bottom side of said cigarette lighter plug (15) being provided with a cylindrical element (151) having a short pivot (152) provided at either side thereof and a plurality of depressions (153) on its peripheral surface, said short pivots (152) capable of fitting into said pivot holes (123) of said pivot seats (122) so that said cigarette lighter plug (15) is pivotally mounted on said pivot seats (122) of said upper casing (12), and said bosses (1241) in said recess (121) may engage said depressions (153) of said cylindrical element (151).

2. A charger with a replaceable electrical plug as claimed in claim 1, wherein said electrical plug (14) may optionally be a three-prong electrical plug and said plastic plug body (141) is a plate-like structure having a protrudent piece (145) at a lower side thereof and a positioning indentation (146) at an upper side thereof such that said protrudent piece (145) may urge against the lower edge of said opening (111) of said lower casing (11), movement of said circular rod (1722) releasing said slide seat (17) for sliding movement whereby said movable fastening piece (115) is movable between positions in which it is engaged with or disengaged from said positioning indentation (146) of said plug body (141) so that said electrical plug (14) may be replaced and secured in said opening (111) of said casing.

\* \* \* \* \*